United States Patent [19]

Hurkx et al.

[11] Patent Number: 5,760,450
[45] Date of Patent: Jun. 2, 1998

[54] SEMICONDUCTOR RESISTOR USING BACK-TO-BACK ZENER DIODES

[75] Inventors: Godefridus A. M. Hurkx; Jan W. Slotboom; Andreas H. Montree, all of Eindhoven, Netherlands

[73] Assignee: U.S. Philips Corporation, New York, N.Y.

[21] Appl. No.: 828,238

[22] Filed: Mar. 31, 1997

[30] Foreign Application Priority Data

Apr. 29, 1996 [EP] European Pat. Off. ............. 96201172

[51] Int. Cl.$^6$ ............... H01L 29/8605; H01L 29/866; H01L 29/78
[52] U.S. Cl. ................. 257/379; 257/106; 257/393
[58] Field of Search ............................... 257/106, 379, 257/393, 603, 903

[56] References Cited

U.S. PATENT DOCUMENTS 3,341,750 9/1967 Lambert et al. ............... 257/106
3,508,084 4/1970 Warner ............... 257/603
3,882,529 5/1975 Warner ............... 257/379
5,293,058 3/1994 Tsividis ............... 257/379

Primary Examiner—Gene M. Munson

[57] ABSTRACT

Very high resistance values may be necessary in integrated circuits, for example in the gigaohm range, for example for realizing RC times of 1 ms to 1 s. Such resistance values cannot or substantially not be realized by known methods in standard i.c. processes because of the too large space occupation. In addition, known embodiments are usually strongly dependent on the temperature. According to the invention, therefore, two zener diodes (10, 4; 11, 4) connected back-to-back are used as the resistor. The current through each zener diode is mainly determined by band—band tunneling when the voltage is not too high, for example up to approximately 0.2 V. This current has a value such that resistors in the giga range can be readily realized on a small surface area. Since the current is mainly determined by intrinsic material properties of silicon, the temperature dependence is very small. The resistor may furthermore be manufactured in any standard CMOS process or bipolar process.

6 Claims, 3 Drawing Sheets

SEMICONDUCTOR RESISTOR USING BACK-TO-BACK ZENER DIODES

BACKGROUND OF THE INVENTION

The invention relates to a semiconductor device comprising a semiconductor body with a surface region which adjoins a surface and which is provided with a resistance element with two connections for applying a voltage across said resistance element.

Integrated circuits in which the resistor is formed by a diffused or implanted surface zone and the connections are conductively connected to said surface zone are generally known. Such resistors occupy very much space if high resistance values are to be achieved. Thus, for example, resistors of the order of 1 gigaohm are required for realizing long RC times of the order of 1 ms or 1 s. Resistors of this size cannot or hardly be realized in the manner described above in a standard CMOS process. In addition, such resistors are strongly temperature-dependent.

SUMMARY OF THE INVENTION

The invention has for its object inter alia to provide a resistance element suitable for use in an integrated circuit with a high resistance value accompanied by a comparatively small surface area. The invention also has for its object to provide such a resistor which can be manufactured in a standard i.c. process, in particular a standard CMOS process. Yet another object of the invention is to provide a resistor which is less temperature-dependent than diffused or implanted resistors. According to the invention, a semiconductor device of the kind described in the opening paragraph is characterized in that the resistance element comprises two diodes connected in series in mutually opposed directions, both having a pn junction between a strongly doped surface zone of the second conductivity type formed in the surface region and an also strongly doped surface zone of the first conductivity type formed in said former surface zone, which surface zones are connected to one another at least during operation and are electrically floating, while the pn junctions have a concentration such that the current in a voltage range around V=0 V is formed at least substantially by band—band tunneling. When a voltage is applied across the resistor, one of the pn junctions is reverse biased, the other one is forward biased. The total resistance is determined by the sum of the resistances across the two pn junctions. The current through the first junction mentioned is mainly formed by band—band tunneling in the diode. The current in the forward biased diode is also determined by band—band tunneling in the case of a lower voltage across the diode. When the voltage increases further, the normal diffusion current through the pn junction increases, determining the current through the pn junction at higher voltages. At lower voltages, however, where the band—band tunneling is prevalent, the current is so weak that resistance values in the giga range may be readily realized here. Since band—band tunneling is substantially independent of the temperature, the resistance value is temperature-dependent to a low degree only. A further important advantage is that the resistor is symmetrical, i.e. its characteristic does not change when the voltage across the resistor is reversed.

A major realization for obtaining diodes of the kind described above is characterized in that the doping concentration of the surface zone of the second conductivity type in each diode is at least approximately $10^{19}$ atoms per $cm^3$ adjacent the pn junctions. It is possible to make the current-voltage characteristic more or less linear through adaptation of the doping profiles. An embodiment which has the advantage that the current-voltage characteristic is practically symmetrical relative to V=0, so that the voltage may be applied in two directions without any problems, is characterized in that the two zones of the first conductivity type have at least substantially the same surface areas.

A further embodiment is characterized in that the surface zones of the second conductivity type of the diodes form a continuous zone which constitutes a common surface zone of the second conductivity type for the diodes. A special embodiment which can be readily manufactured in a standard CMOS process is characterized in that the surface zones of the second conductivity type are situated at a distance from one another and form a source and a drain zone of a MOS transistor with a channel region between the surface zones of the second conductivity type and a gate electrode situated above the channel region and insulated therefrom by an electrically insulating layer.

BRIEF DESCRIPTION OF THE DRAWINGS

These and other aspects of the invention will be explained in more detail with reference to a few embodiments. In the drawing.

DETAILED DESCRIPTION

Figure 1:
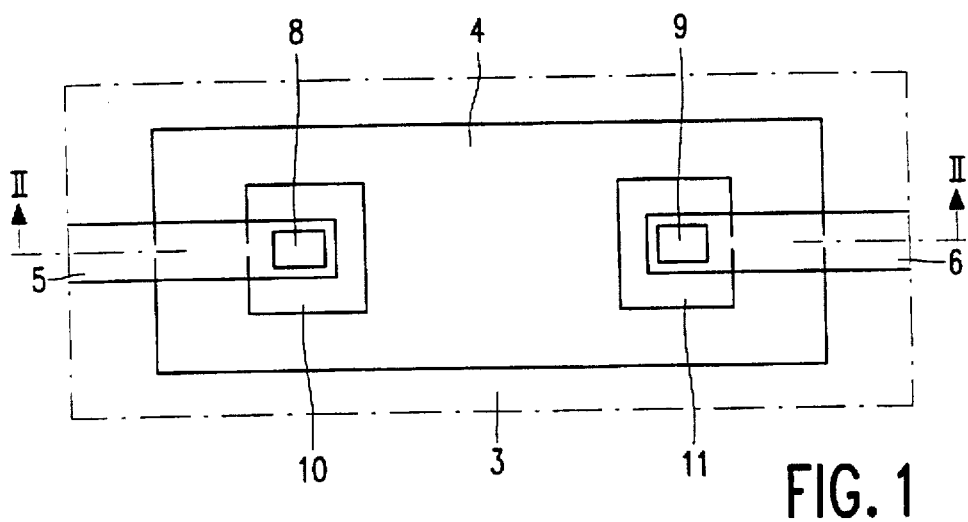
FIG. 1 is a plan view of a semiconductor device according to the invention.
Figure 2:
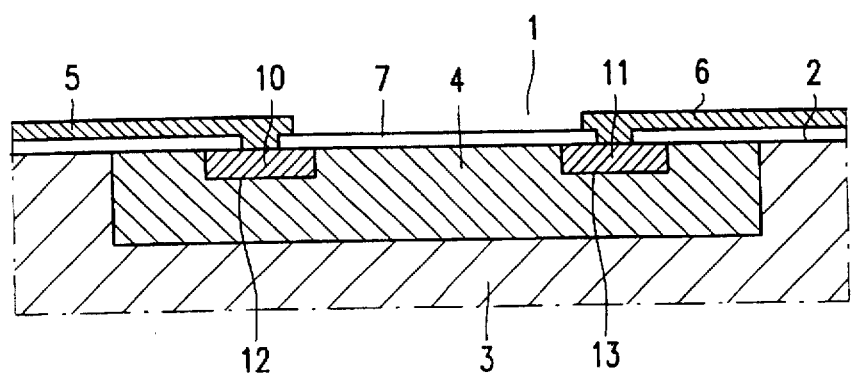
FIG. 2 is a cross-section of the device of FIG. 1 taken on the line II—II.
Figure 3:
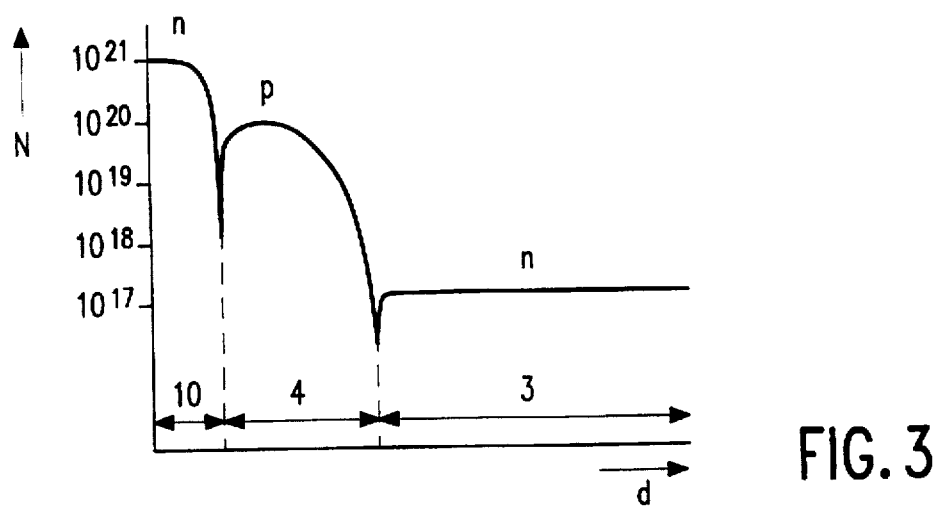
FIG. 3 shows the doping profile of this resistor in a direction transverse to the surface.

The semiconductor device shown in plan view in FIG. 1 and in cross-section in FIG. 2 comprises an integrated circuit of which only the resistor 1 is shown in the drawing, but which in addition comprises a large number of other circuit elements which may form a CMOS circuit or BiCMOS circuit or bipolar circuit. Since these further circuit elements may be of a type known per se, they are not shown in the drawing and will not be described here, or only in as far as they happen to be relevant. The device comprises a semiconductor body of, for example, silicon of which only a surface region 3 is shown in the drawing, adjoining the surface 2 and covered with a dielectric layer 7 of, for example, silicon oxide. The surface region 3 is of a first conductivity type, in this example the n-type, with a comparatively low doping concentration of approximately $10^{17}$ atoms per $cm^3$. The resistor further comprises two connections 5 and 6 for applying a voltage across the resistor. The connections are formed in a manner known per se by conductor tracks of metal or semiconductor material applied on the oxide layer 7 and connected to the semiconductor body via windows 8 and 9. According to the invention, the resistance element comprises two diodes (10,4; 11,4) connected in series in mutually opposed directions, of which in this example one of the anode/cathode regions is formed by a continuous zone 4 constituting a common zone of the diodes. This zone is formed by a surface zone 4 of the second, opposed conductivity type, so the p-type in this example, provided in the surface region 3 and having a comparatively high surface concentration of a value between, for example, $10^{19}$ and $10^{20}$ atoms per $cm^3$. According to the invention, the p-type zone 4 is electrically floating, i.e. itself not provided with a separate current-conducting connection, while the connections 5 and 6 are conductively connected to respective n-type surface zones 10 and 11 formed in the p-type zone 4. The zones 10 and 11 have a comparatively high doping concentration and form pn junctions 12 and 13, respectively, with the p-type zone 4 with a concentration gradient such that the current through the pn junctions is determined at least substantially by band—band tunneling in the semiconductor material in a voltage range around V=0 V, in a manner similar to inter alia zener diodes. A possible doping profile is shown in FIG. 3, where the parameter d represents the depth in the semiconductor body 3 measured from the surface. The doping in region 3 is weak, having a value of, for example, $10^{17}$ atoms per $cm^3$. This concentration has a constant value as a function of d in FIG. 3, but it will be obvious that this is not necessarily the case and that this concentration may vary as a function of d, for example when the region 3 is formed by a diffused or implanted well. The p-type zone has a high doping concentration with a maximum of between $10^{19}$ and $10^{20}$ boron atoms per $cm^3$ adjacent the pn junction 12 (or 13). The n-type zone 10 has an even higher doping concentration and forms the pn junction 12 with the p-type zone 4 at a depth of approximately 0.15 μm from the surface.

Figure 4:
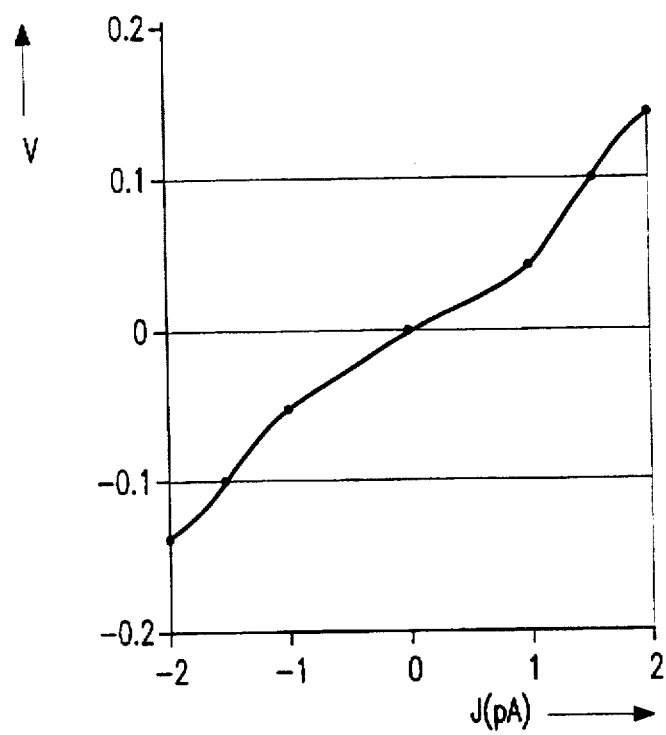
FIG. 4 shows the current-voltage characteristic of the resistor shown in FIGS. 1 to 3.

During operation a voltage is applied to the connections 5 and 6 which is lower than the voltage at which electrical breakdown (punch-through, avalanche breakdown, etc.) occurs. One of the pn junctions 12 and 13 will be forward biased, the other one reverse biased. Since the current in this type of diode is stronger in the reverse bias direction than in the forward bias direction, at least for a low voltage, the major portion of the voltage across the diode will be in the forward direction. FIG. 4 shows the current-voltage characteristic for an embodiment with diodes each having a surface area of approximately 10 $\mu m^2$. The distance between the zones 10 and 11 is of no importance for the operation of the resistor as long as no punch-through occurs, but it is kept as small as possible in view of the space occupation. As is apparent from the drawing, the resistor is reasonably linear and has a value of approximately 60 gigaohms for V=0.1 V. The total surface area occupied by the resistor is very small in spite of the high resistance value. In addition, the zones 4, 10 and 11 can be manufactured in process steps which will be carried out anyway in existing i.c. processes. Thus, for example, the p-type zone 4 may be made simultaneously with the source and drain zones of the p-channel transistor, and the n-type zones 10 and 11 simultaneously with the source and drain zones of n-channel transistors in a CMOS process. This renders it possible to realize very high resistance values, in particular in the gigaohm range, on a very small surface area in a standard i.c. process without additional process steps.

Figure 5:
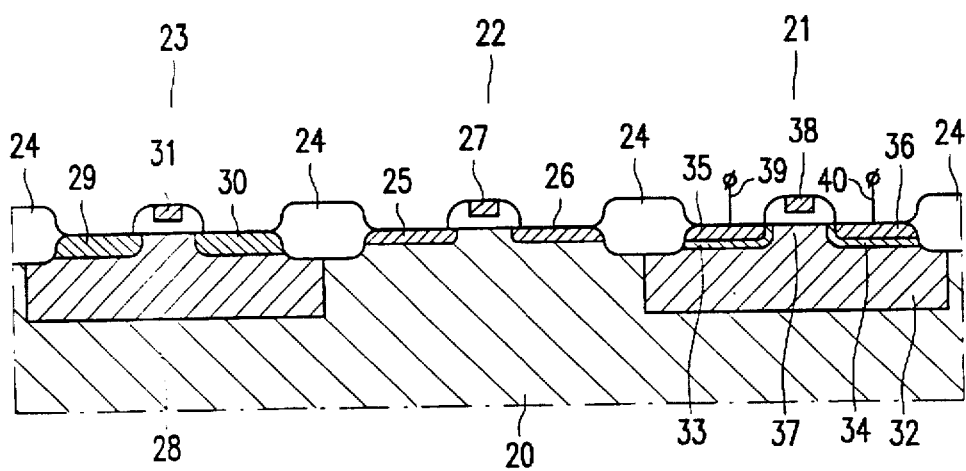
FIG. 5 is a cross-section of a second embodiment of a semiconductor device according to the invention.

FIG. 5 shows an embodiment in which the p-type zones (anodes) of the diodes of the resistor are formed by zones separated from one another by an interposed portion of the semiconductor body. This embodiment is based on a p-type silicon body 20 at whose surface a number of active regions 21, 22, 23 are defined by means of a pattern 24 of field oxide. An n-channel MOS transistor is formed in the region 22, with an n-type source zone 25, an n-type drain zone 26, and a gate electrode 27. The active region 23 comprises an n-well 28 with p-type zones 29 and 30 therein, forming the source and drain zones of a p-channel MOS transistor with insulated gate 31. The resistor is formed in the active region 21, with two back-to-back zener diodes according to the invention. The region 21 is for this purpose provided with an n-well 32 which is manufactured simultaneously with the n-well 28 of the p-MOST. Simultaneously with the source and drain zones 29, 30 of the p-MOST, p-type zones (anodes) 33 and 34 of the zener diodes are provided in the well 32. The n-type zones 35 and 36 forming the cathodes of the zener diodes are formed in the p-type zones 33, 34 simultaneously with the source and drain zones of the n-MOST. The resistor is constructed as a p-channel MOST in which the p-type zones 33 and 34 form the source and drain zones, mutually separated by a channel region 37, with a gate electrode 38 by means of which an inversion layer can be formed in the channel region during operation, which layer interconnects the zones 33 and 34. The manufacture of the resistor according to this embodiment is practically the same as the manufacture of the p-MOST in the sense that it can take place through the same windows for the n-type zones 35 and 36 and for the p-type zones 33 and 34, i.e. self-aligned with respect to the gate electrode 38. As a result, the dimensions of the resistor can be of the same order as those of the transistors, i.e. very small. The resistance value between the connections 39 and 40 (indicated diagrammatically in the drawing) is mainly determined by the resistances across the two pn junctions, which are so great that the resistance of the inversion channel between the zones 33 and 34 is not relevant.

Figure 6:
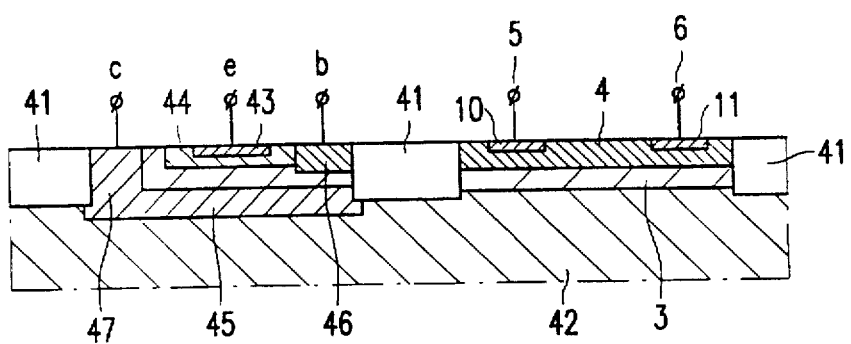
FIG. 6 is a cross-section of a further embodiment of a semiconductor device according to the invention.

FIG. 6 is a cross-section of a further embodiment of a semiconductor device according to the invention where the resistor is integrated in a bipolar or BiCMOS circuit. The construction of the resistor is identical to that of the resistor 1 in the first example in principle, comprising two back-to-back zener diodes again with a common strongly doped p-type zone in which two even more strongly doped n-type zones 10 and 11 are provided, fitted with the connections 5 and 6. The p-type zone 4 is provided in an n-type island-shaped surface region 3 which is laterally bounded by insulation regions 41 of silicon oxide and is formed from an n-type epitaxial layer on a p-type silicon substrate 42. The drawing shows a further island with a bipolar transistor therein, comprising an n-type emitter 43, a p-type base 44, and an n-type buried collector 45. The emitter, base, and collector are provided with respective connections e, b and c, a strongly doped base contact zone 46 being provided at the area of the base connection b and a strongly doped collector contact zone 47 at the area of the collector connection c. The doping concentration of the (intrinsic) base is sufficiently high, as is usual, for obtaining a low base resistance, but is preferably also so low that band—band tunneling is prevented at the emitter-base junction. For this reason the p-type zone 4 of the resistor is preferably provided simultaneously with the base contact zone 46 whose concentration has a value of between $10^{19}$ and $10^{20}$ atoms per $cm^3$.

Figure 7:
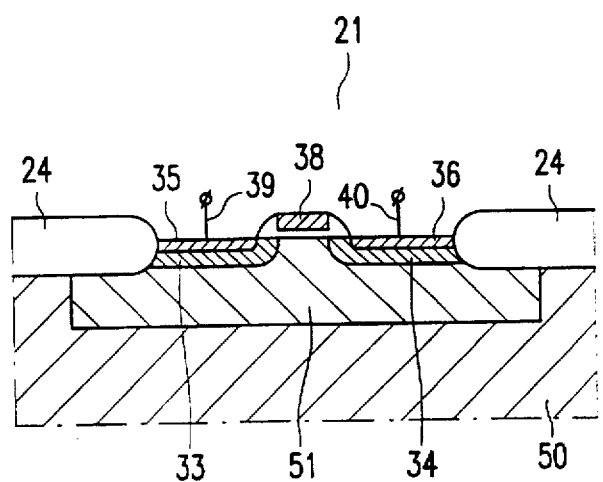
FIG. 7 is a cross-section of a still further embodiment of a device according to the invention.

FIG. 7 is a cross-section of a modification of the version of FIG. 5. The same reference numerals as in FIG. 5 are used in FIG. 7 for corresponding components for simplicity's sake, the resistor only being shown here. The main difference with FIG. 5 is that an n-type substrate 50 is now used, provided with a p-type well 50. The strongly doped p-type zones 33 and 34 are formed simultaneously with the p-type source/drain zones of the pMOS transistors again and are conductively interconnected by the well 50 in this example.

Figure 8:
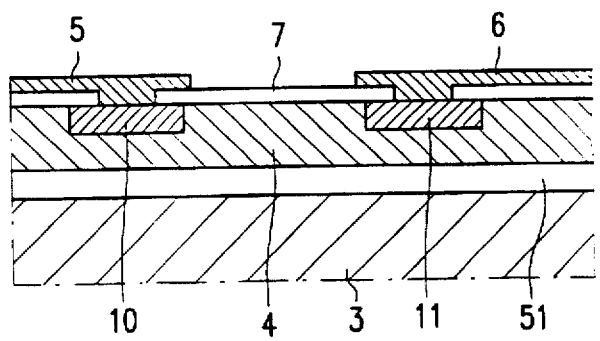
FIG. 8 is a cross-section of yet another embodiment of a device according to the invention.

The strongly doped n-type zones 35 and 36, connected to the connections 39 and 40, are formed simultaneously with the n-type source/drain zones of the n-MOS transistors. FIG. 8 shows a modification of the embodiment of FIGS. 1 and 2 which has the advantage inter alia that crosstalk with the substrate 3 is reduced. The same reference numerals were used again in the drawing for parts corresponding to those in FIGS. 1 and 2. The p-type zone in this embodiment does not form a pn junction with the substrate 3 but is separated from the substrate by a buried oxide layer 51. The oxide layer 51 may be obtained in a manner known per se, for example by implantation of oxygen ions.

It will be obvious that the invention is not limited to the embodiments described here but that many more variations are possible to those skilled in the art within the scope of the invention. Thus, for example, the conductivity types may be reversed in the examples given. The connections 5 and/or 6 may be formed in a manner other than by metal tracks, for example by doped zones in the semiconductor body.

What is claimed is:

1. A semiconductor device comprising a semiconductor body with a surface region which adjoins a surface and which is provided with a resistance element with two connections for applying a voltage across said resistance element, characterized in that the resistance element comprises two diodes connected in series in mutually opposed directions, both having a pn junction between a strongly doped surface zone of the second conductivity type formed in the surface region and an also strongly doped surface zone of the first conductivity type formed in said former surface zone, which surface zones are connected to one another at least during operation and are electrically floating, while the pn junctions have a concentration gradient such that the current in a voltage range around V=0 V is formed at least substantially by band—band tunneling.

2. A semiconductor as claimed in claim 1, characterized in that the doping concentration of the surface zone of the second conductivity type in each diode is at least approximately $10^{19}$ atoms per $cm^3$ adjacent the pn junctions.

3. A semiconductor device as claimed in claim 1, characterized in that the two zones of the first conductivity type have at least substantially the same surface areas.

4. A semiconductor device as claimed claim 1, characterized in that the surface zones of the second conductivity type of the diodes form a continuous zone which constitutes a common surface zone of the second conductivity type for the diodes.

5. A semiconductor device as claimed in claim 1, characterized in that the surface zones of the second conductivity type are situated at a distance from one another and form a source and a drain zone of a MOS transistor with a channel region between the surface zones of the second conductivity type and a gate electrode situated above the channel region and insulated therefrom by an electrically insulating layer.

6. A semiconductor device as claimed in claim 5, characterized in that the resistor forms part of a CMOS integrated circuit.

* * * * *